United States Patent
Porter et al.

(10) Patent No.: US 10,836,899 B2
(45) Date of Patent: Nov. 17, 2020

(54) POLYESTERS WITH SPECIFIED CRYSTALLIZATION HALF-TIMES

(71) Applicant: Eastman Chemical Company, Kingsport, TN (US)

(72) Inventors: David Scott Porter, Blountville, TN (US); Wentao Li, Kingsport, TN (US); Sarah Exley Goetz, Kingsport, TN (US); Aireal Denise Pressley, Limestone, TN (US); Amit Vasant Desai, Houston, TX (US); Yue Rachel Hu, Mountain View, CA (US); Steven J. Adams, Gray, TN (US)

(73) Assignee: Eastman Chemical Company, Kingsport, TN (US)

( * ) Notice: Subject to any disclaimer, the term of this patent is extended or adjusted under 35 U.S.C. 154(b) by 41 days.

(21) Appl. No.: 16/219,085

(22) Filed: Dec. 13, 2018

(65) Prior Publication Data
US 2020/0190318 A1 Jun. 18, 2020

(51) Int. Cl.
| | | |
|---|---|---|
| C08L 67/02 | (2006.01) |
| H01L 31/049 | (2014.01) |
| C08G 63/199 | (2006.01) |
| C08G 63/40 | (2006.01) |
| C08G 63/672 | (2006.01) |
| B29C 45/00 | (2006.01) |
| B29K 67/00 | (2006.01) |

(52) U.S. Cl.
CPC .......... *C08L 67/025* (2013.01); *C08G 63/199* (2013.01); *C08G 63/40* (2013.01); *C08G 63/672* (2013.01); *H01L 31/049* (2014.12); *B29C 45/0001* (2013.01); *B29K 2067/00* (2013.01); *C08L 2203/16* (2013.01)

(58) Field of Classification Search
USPC ........................................................ 528/298
See application file for complete search history.

(56) References Cited

U.S. PATENT DOCUMENTS

| | | |
|---|---|---|
| 3,081,334 A | 3/1963 | Kauer |
| 3,228,984 A | 1/1966 | Humber |
| 3,255,254 A | 6/1966 | Kauer |
| 3,256,241 A | 6/1966 | Watson |
| 3,301,827 A | 1/1967 | Martin |
| 3,337,498 A | 8/1967 | Hogsed |
| 3,367,941 A | 2/1968 | Gregory |
| 3,533,594 A | 10/1970 | Segmüller |
| 3,546,290 A | 12/1970 | Kauer |
| 4,020,141 A | 4/1977 | Quinn |
| 4,355,080 A | 10/1982 | Zannucci |
| 4,448,998 A | 5/1984 | King |
| 4,486,561 A | 12/1984 | Chung et al. |
| 5,707,667 A | 1/1998 | Galt et al. |
| 6,183,848 B1 | 2/2001 | Turner et al. |
| 6,368,532 B1 | 4/2002 | Otoshi et al. |
| 6,649,600 B1 | 11/2003 | Kiesman et al. |
| 6,921,736 B1 | 7/2005 | Nolan |
| 7,132,499 B2 | 11/2006 | Tobita et al. |
| 7,781,562 B2 | 8/2010 | Crawford et al. |
| 9,082,912 B2 | 7/2015 | Levy |
| 9,328,050 B1 | 5/2016 | Boppana et al. |
| 2006/0004151 A1 | 1/2006 | Shaikh et al. |
| 2008/0053512 A1 | 3/2008 | Kawashima |
| 2008/0125567 A1* | 5/2008 | Ramaraju ............ C08G 63/16 528/302 |
| 2010/0324207 A1 | 12/2010 | Sturzel et al. |

(Continued)

FOREIGN PATENT DOCUMENTS

| | | |
|---|---|---|
| FR | 1 374 693 | 10/1964 |
| GB | 1 024 487 | 3/1966 |

(Continued)

OTHER PUBLICATIONS

Adkins, Homer and Wojcik, Bruno; "Hydrogenation of Amides to Amines"; Journal of the American Chemical Society—Communications to the Editor; p. 247; 1934.

Agfa, Power by Technology; "UNIQOAT—The Single-Layer Backsheet"; 2 pages; Jun. 2018; retrieved from website: http://www.agfa.com/specialty_products/solutions/solar-pv-backsheet/uniqoat.

Bailey, William J. and Golden, Harold R.; "Cyclic Dienes. I. 1,2-Dimethylenecyclohexane"; Journal of the American Chemical Society; pp. 4780-4782; Oct. 5, 1953.

(Continued)

*Primary Examiner* — Terressa Boykin
(74) *Attorney, Agent, or Firm* — Tammye L. Taylor

(57) ABSTRACT

A semi-crystalline polyester comprising a repeat unit of the formula:

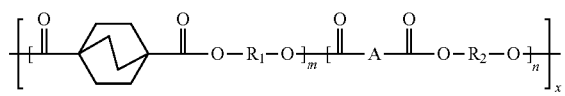

wherein A is an aliphatic, aromatic, or heterocyclic group; $R_1$ is selected from the group consisting of 1,4-butanediol residue and 1,4-cyclohexanedimethanol residue; $R_2$ is neopentanediol residue; m is between 50 and 99 inclusive; n is between 1 and 50 inclusive; x is between 1 and 200 inclusive; and wherein said semi-crystalline polyester exhibits a minimum crystallization half-time of about 0.3 minutes or greater, or about 0.5 minutes or greater or about 0.6 minutes or greater or about 0.7 minutes or greater is described. The polyesters of the present invention may in various embodiments demonstrate one or more desirable performance characteristics and accordingly are particularly useful in applications and utilities wherein those high levels of performance for such characteristics are required. A process for forming the semi-crystalline polyester is also disclosed.

18 Claims, No Drawings

(56) References Cited

U.S. PATENT DOCUMENTS

| | | | |
|---|---|---|---|
| 2011/0091705 | A1 | 4/2011 | Shih et al. |
| 2014/0087990 | A1 | 3/2014 | Kitamura |
| 2016/0039780 | A1 | 2/2016 | Shi et al. |

FOREIGN PATENT DOCUMENTS

| | | |
|---|---|---|
| JP | 06 032882 A | 2/1994 |
| WO | WO 00 47635 A1 | 8/2000 |
| WO | WO 2006 128184 A2 | 11/2006 |
| WO | WO 2018 075301 A1 | 4/2018 |

OTHER PUBLICATIONS

Baleizão, Carlos et al.; "Oxime Carbapalladacycle Covalently Anchored to High Surface Area Inorganic Supports or Polymers as Heterogeneous Green Catalysts for the Suzuke Reaction in Water"; Journal of Organic Chemistry, 69; pp. 439-446; 2004.

Bedford, Robin B. et al.; "Silica-supported imine palladacycles-recyclable catalysts for the Suzuki reaction?"; Journal of Organometallic Chemistry, 633; pp. 173-181; 2001.

Carr, N. et al.; "A Comparison of the Properties of Some Liquid Crystal Materials Containing Benzene, Cyclohexane, and Bicyclo[2.2.2]octane Rings"; Molecular Crystals and Liquid Crystals, vol. 66; pp. 267-282; 1981.

Chang, Hexi, et al.; "Convenient One-Pot Preparation of Dimethyl Bicyclo[2.2.2]octane-1,4-dicarbolylate, a Key Intermediate for a Novel Adenosine $A_1$ Receptor Antagonist"; Synthetic Communications, vol. 37; pp. 1267-1272; 2007.

Clark, Jim; "Making Amines"; 6 pages; 2004, modified Mar. 2016; retrieved from website: https://www.chemguide.co.uk/organicprops/amines/preparation.html.

Corma, Avelino et al.; "A periodic mesoporous organosilica containing a carbapalladacycle complex as heterogeneous catalyst for Suzuki cross-coupling"; Journal of Catalysis, 229; pp. 322-331; 2005.

Corma, Avelino et al.; "An imidazolium ionic liquid having covalently attached an oxime carbapalladacycle complex as ionophilic heterogeneous catalysts for the Heck and Suzuki-Miyaura cross-coupling"; Tetrahedron, 60; pp. 8553-8560; 2004.

Dewar, Michael J. S. and Goldberg, Ronald S.; "The Role of ρ-Phenylene Groups in Nematic Liquid Crystals"; Journal of the American Chemical Society, 92:6; pp. 1582-1586; Mar. 25, 1970.

Dotrong, M. et al.; "Synthesis, Characterization, and Properties of Colorless Rigid-Rod Poly(benzobisthiazole) Derived from Bicyclo[2.2.2]octane"; Journal of Polymer Science: Part A: Polymer Chemistry, vol. 32; pp. 2953-2960; 1994.

Fehling; "Ueber die Bernsteinsäure und ihre Verbindungen"; Justus Liebigs Annalen der Chemie, 49; pp. 154-212; 1844 (Original Language).

Ferreira, Arthur Batista et al.; "Tin-Catalyzed Esterification and Transesterification Reactions: A Review"; International Scholarly Research Network (ISRN Renewable Energy), vol. 2012, Article ID 142857, 13 pages.

Friberg, Annika et al.; "Efficient bioreduction of bicyclo[2.2.2]octane-2,5-dione and bicyclo[2.2.2]oct-7-ene-2,5-dione by genetically engineered *Saccharomyces cerevisiae*"; Organic & Biomolecular Chemistry, 4; pp. 2304-2312; 2006.

Geivandov, R. KH et al.; "New synthesis of 1,4-dihydroxybicyclo[2.2.2]octane" Zhurnal Organicheskoi Khimii; pp. 218-219; Jan. 1, 1979 (Original Language).

Gu, Xin et al.; "Discovery of 4-heteroarylbicyclo[2.2.2]octyltriazoles as potent and selective inhibitors of 11β-HSD1: Novel therapeutic agents for the treatment of metabolic syndrome"; Bioorganic & Medicinal Chemistry Letters 15; pp. 5266-5269; 2005.

Guha, P. C.; "Para-Brückenbildung beim Succinylo-bernsteinsäureäthylester, I. Mitteil.: Bildung von Bicyclo-[1.2.2]-heptan-, Bicyclo[2.2.2]octan- und Bicyclo-[3.2.2]-nonan-Systemen"; Chemische Berichte, vol. 72, Part 2; pp. 1359-1373; 1939 (Original Language).

Gürbüz, Nevin et al.; "Surface Modification of Inorganic Oxide Particles with a Carbene Complex of Palladium: A Recyclable Catalyst for the Suzuki Reaction"; Journal of Inorganic and Organometallic Polymers, vol. 14, No. 2; p. 149; Jun. 2004.

Guyer, von A. et al.; "197. Über die katalytische Reduktion aliphatischer Carbonsäureamide"; Helv. Chim. Acta, vol. XXXVIII; pp. 1649-1654; 1955 (Original Language).

Harruna, Issifu I. and Polk, Malcolm B.; "Thermotropic Copolyesters. II. Synthesis and Characterization of Copolyesters Containing the Bicyclo[2.2.2]oct-2-ene Mesogenic Unit"; Journal of Polymer Science: Part A: Polymer Chemistry, vol. 26; pp. 2171-2182; 1988.

Harruna, Issifu I. and Polk, Malcolm B.; "Thermotropic Homopolyester. I. Synthesis and Characterization of Homopolyesters Containing the Mesogenic Unit, Bicyclo[2.2.2]oct-2-ene"; Journal of Polymer Science: Part A: Polymer Chemistry, vol. 28; pp. 285-298; 1990.

Harruna, Issifu I. and Polk, Malcolm B.; "Thermotropic copolyesters: 3. Synthesis and characterization of liquid crystal copolyesters containing the bicyclo[2.2.2]octane mesogenic unit"; Polymer Communications, vol. 32, No. 2; pp. 39-41; 1991.

He, De-Hua et al.; "Hydrogenation of Carboxylic Acids Using Bimetallic Catalysts Consisting of Group 8 to 10 and Group 6 or 7 Metals"; Tetrahedron Letters, vol. 36, No. 7; pp. 1059-1062; 1995.

Hirosawa, Chitaru et al.; "Hydrogenation of Amides by the Use of Bimetallic Catalysts Consisting of Group 8 to 10 and Group 6 or 7 Metals" Tetrahedron Letters, vol. 37, No. 37; pp. 6749-6752; 1996.

Holtz, Hans D. and Stock, Leon M.; "The Preparation of 1-Carobyx-4-substituted Bicyclo [2.2.2]octanes"; Journal of the American Chemical Society, vol. 86; pp. 5183-5188; Dec. 5, 1964.

Humber, L. G. et al.; "Agents Affecting Lipid Metabolism XIII. The Synthesis of 1,4-disubstituted Bicyclo[2.2.2]Octane Derivatives"; Candian Journal of Chemistry, vol. 42; pp. 2852-2861; 1964.

Kauer, J. C. et al; "Bridgehead-Substituted Bicyclo[2.2.2]octanes. I. Addition of Ethylene to Cyclohexa-1,3-diene-1,4-dicarboxylic Acid Derivatives"; Journal of Organic Chemistry, vol. 30; pp. 1431-1436; May 1965.

Kopecký, Jan and Šmejkal, Jaroslav; "Synthesis of Bridgehead Chloro- Bromo- and Iodobicyclo[2.2.2]octanes"; Collection Czechoslovak Chemical Communications, vol. 45; p. 2965; 1980.

Kopecký, Jan et al.; "Synthesis of Bridgehead Bicyclo[2.2.2]octanols"; Collection of Czechoslovak Chemical Communications, vol. 46; pp. 1370-1375; 1981.

Kopecký, Jan and Šmejkal, Jaroslav; "The Synthesis of 1,4-Dihydroxy- and 1,4-Dihalogenobicyclo[2.2.2]octanes"; Tetrahedron Letters, No. 40; pp. 3889-3891; Jul. 1967.

Kuehne, Me. E. and Lambert, B. F.; "1,4-Dihydrobenzoic Acid [2,5-Cyclohexadiene-1-carboxylic acid]"; Organic Synthesis, Coll., vol. 43; p. 22; 1963.

Lemouchi, Cyprien et al.; "Ultra-fast Rotors for Molecular Machines and Functional Materials via Halogen Bonding: Crystals of 1,4-Bis(iodoethynyl)bicyclo[2.2.2]octane with Distinct Gigahertz Rotation at Two Sites"; Journal of the American Chemical Society, vol. 133; pp. 6371-6379; 2011.

Lenz, Robert W. et al.; Properties of a liquid crystalline polyester with a mesogen containing the bicyclooctylene ring: Liquid Crystals, 4:3; pp. 317-323; 1989.

Liu, Yanchun; "Synthesis and Characterization of Amorphous Cycloaliphatic Copolyesters with Novel Structures and Architectures"; Liu Dissertation submitted to Virginia Polytechnic Institute and State University; 260 pages; Mar. 22, 2012.

Liu, Yanchun and Turner, Richard; "Synthesis and Properties of Cyclic Diester Based Aliphatic Copolyesters"; Journal of Polymer Science: Part A: Polymer Chemistry, vol. 48; pp. 2162-2169; 2010.

Magro, Angel A. Núñez et al.; "The synthesis of amines by the homogeneous hydrogenation of secondary and primary amides"; Chemical Communications; pp. 3154-3156; 2007.

Nuding, G. et al; "Rodlike Molecules by Kolbe Electrolysis"; Synthesis; pp. 71-76; Jan. 1996.

Otera, Junzo; "Transesterification"; Chemical Reviews, vol. 93; pp. 1449-1470; 1993.

Polk, Malcolm et al.; "Thermotropic Copolyesters Containing the Bicyclo[2.2.2]0ctane Ring System"; Molecular Crystals and Liquid Crystals Incorporating Nonlinear Optics, vol. 157; pp. 1-11; 1988.

(56) References Cited

OTHER PUBLICATIONS

Polk, Malcolm and Onwumere, Fidelis C.; "Thermotropic Copolyesters. 1. Synthesis and Characterization of Liquid Crystal Copolyesters Containing the Bicyclo[2.2.2]octane Ring System"; Journal Macromolecular Science-Chem., A23 (3); pp. 423-432; 1986.

Polk, Malcolm B. et al.; "Thermotropic Copolyesters. II. Synthesis and Characterization of Liquid-Crystal Copolyesters Containing the Bicyclo[2.2.2]Octane Ring System"; Journal of Polymer Science: Park A: Polymer Chemistry, vol. 24; pp. 1923-1931; 1986.

Polk, Malcolm B. et al.; "Thermotropic Copolyesters. III. Synthesis and Characterization of Liquid Crystal Copolyesters Containing the Bicyclo[2.2.2]octane Ring System"; Journal of Polymer Science: Park A: Polymer Chemistry, vol. 26; pp. 2405-2422; 1988.

Polshettiwar, Vivek et al.; "Silica-supported palladium: Sustainable catalysts for cross-coupling reactions"; Coordination Chemistry Reviews, vol. 253; pp. 2599-2626; 2009.

Roberts, John D. et al.; "Syntheses of Some 4-Substituted Bicyclo[2.2.2]octain-1-carboxylic Acids"; Journal of the American Chemical Society, vol. 75; pp. 637-640; Feb. 5, 1953.

Scheiner, Peter et al.; "Snthesis of Bicyclic Nitriles and Related Compounds. II"; Journal of Organic Chemistry, vol. 28; pp. 2960-2965; 1963.

Taimr, Ludek and Smith, James G.; "Polyesters Containing Bicyclo[2.2.2]octane and Bicyclo[3.2.2]nonane Rings"; Journal of Polymer Science: Part A-1, vol. 9; pp. 1203-1211; 1971.

Weis, Robert et al.; "4-Aminobicyclo[2.2.2]octanone Derivatives with Antiprotozoal Activities"; Monatshefte für Chemie (Chemical Monthly), vol. 134; pp. 1019-1026; 2003.

Whitney, Joel G. et al.; "Antiviral Agents. I. Bicyclo[2.2.2]octan- and -oct-2-enamines"; Journal Medical Chemistry, vol. 13; pp. 254-260; Mar. 1970.

Zhdankin, Viktor V.; "Hypervalent iodine(III) reagents in organic synthesis" APKIVOC—Special Issue Reviews and Accounts, (i); pp. 1-62; 2009.

Notification of Transmittal of the International Search Report and the Written Opinion of the International Searching Authority, or the Declaration dated Dec. 19, 2017 received in International Application No. PCT/US2017/056027.

Notification of Transmittal of the International Search Report and the Written Opinion of the International Searching Authority, or the Declaration dated Jan. 4, 2019 received in International Application No. PCT/US2018/055138.

Co-pending U.S. Appl. No. 16/339,950, filed Oct. 11, 2017; Yue Rachel Hu.

Notification of Transmittal of the International Search Report and the Written Opinion of the International Searching Authority, or the Declaration dated Mar. 2, 2020 received in International Application No. PCT/US2019/065923.

Co-pending U.S. Appl. No. 16/754,206, filed Apr. 7, 2020; Yue Rachel Hu.

* cited by examiner

POLYESTERS WITH SPECIFIED CRYSTALLIZATION HALF-TIMES

FIELD OF THE INVENTION

The present invention relates generally to improved polyesters, compositions containing such improved polyesters and articles such as films and injection molded articles formed from such improved polyesters.

BACKGROUND OF THE INVENTION

Polyesters are often viewed as the world's most used class of polymers, with published world production volumes (including recycling) recently reported to be well in excess of 75 million tons. This level of commercial success is likely attributable in part to polyesters' attractive combination of relative cost, manufacturability and competitive performance attributes. Polyester's physical, chemical and thermal properties make them useful and desirable for a wide variety of end-use applications. Polyethylene terephthalate (PET) is probably one of the most popular types of polyester for many end-uses.

Despite these commercial volumes, polyesters generally have had more limited success in penetrating certain end-use markets, for example in the manufacture of injection molded articles, especially those used in higher-temperature applications such as under-the-hood vehicle parts. For example, U.S. Pat. No. 4,486,561 provides that PET "is not always the material of choice for injection molding usage because relatively high mold temperatures, e.g., 120° -140° C., must be utilized to insure good moldability". Attempts to develop commercially cost-competitive injection-moldable and/or higher-melting point temperature polyesters have met with limited success.

Also, as noted in U.S. Pat. No. 4,355,080, issued to the assignee of the present invention, certain older-generation polyesters generally "have not found acceptance as sheeting materials for signs, windows and the like because of embrittlement and surface deterioration on ageing, particularly under outdoor weathering conditions". The invention of the '080 patent addresses this issue via an invention wherein "acrylic polymers can be compression laminated to the surface of polyester substrates to produce a permanently bonded composite sheet having excellent retention of surface and physical properties on extended weathering." Though this solution is purported to address weatherability, it requires additional materials and processing steps that add significant manufacturing cost. Also notable on polyester weatherability is U.S. Pat. No. 7,132,499, which describes a polyester container with improved weatherability wherein the container is made of a polyester resin composition comprising (A) 100 parts by weight of a polyester resin and (B) 0.01 to 10 parts by weight of a certain triazine ultraviolet absorber. As with many general attempts to resolve polymer deficiencies with additives, the additive materials can increase cost and impact processability of the composition and may also have limited efficacy and undesirable side-effects on other aspects of composition performance.

Modifications within the general polyester polymer structure have been explored to generally improve various aspects of polyester performance. For example U.S. Pat. No. 3,256,241 describes polyesters that are prepared by reacting 1,4-bicyclo[2.2.2]octanedicarboxylic acid, or an ester-forming derivative thereof, with a dihydroxy compound or an ester-forming derivative thereof. These polyester products are generally characterized by good stability to light, both outdoors and indoors; however, their crystallization half-time and other characteristics make them less compatible (if not incompatible) for processing in equipment and systems currently utilized in manufacture of end products from more common polyesters such as polyethylene terephthalate (PET). Further, none of the polyesters described in the '241 patent are expected to perform well in forming injection molded articles or reach melt points suitable for high-temperature applications.

Despite these techniques to improve polyesters and polyester compositions as to meet the newest and highest performance specifications, the need remains for improved polyesters that meet processability requirements for existing end-product manufacturing systems while cost-effectively satisfying performance specifications and maintaining them over time.

SUMMARY OF THE INVENTION

In a first aspect, the present invention relates to a semi-crystalline polyester comprising a repeat unit of the formula:

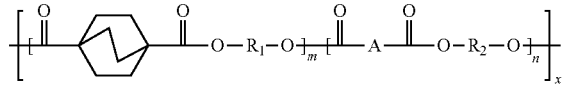

wherein A is an aliphatic, aromatic, or heterocyclic group; $R_1$ is selected from the group consisting of 1,4-butanediol and 1,4-cyclohexanedimethanol residue; $R_2$ is neopentanediol residue; m is between 50 and 99 inclusive; n is between 1 and 50 inclusive; x is between 1 and 200 inclusive; and wherein said semi-crystalline polyester exhibits a minimum crystallization half-time of about 0.3 minutes or greater, or about 0.5 minutes or greater or about 0.6 minutes or greater or about 0.7 minutes or greater.

In another aspect, the present invention relates to a composition that includes a polyester of the first aspect of the present invention.

In still another aspect, the present invention relates to a film, particularly a monolayer film, that includes a semi-crystalline polyester of the first aspect of the present invention.

In yet another aspect, the present invention relates to an injection molded article that includes a semi-crystalline polyester of the first aspect of the present invention.

In yet another aspect, the present invention is directed to a method for making a semi-crystalline polyester having a repeat unit of the formula:

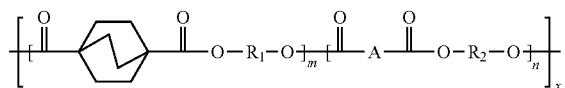

wherein A is an aliphatic, aromatic, or heterocyclic group; $R_1$ is selected from the group consisting of 1,4-butanediol and 1,4-cyclohexanedimethanol residue; $R_2$ is neopentanediol residue; m is between 50 and 99 inclusive; n is between 1 and 50 inclusive; x is between 1 and 200 inclusive, or between 80 and 160 inclusive; and wherein said semi-crystalline polyester exhibits a minimum crystallization half-time of about 0.3 minutes or greater, or about 0.5 minutes or greater or about 0.6 minutes or greater or about 0.7 minutes or greater;

wherein the method includes the steps of (A) contacting a compound of the formula

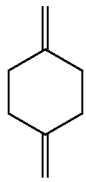

with (i) a transition metal catalyst comprising a palladium compound and (ii) an oxidizing agent, optionally in the presence of at least one of (I) a compound of the formula

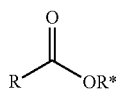

wherein R is chosen from hydrogen; and $C_1$-$C_{12}$ alkyl, optionally substituted by one or more of groups chosen from $C_1$-$C_6$ alkoxy, halo, nitro, and cyano; R* is chosen from hydrogen; $C_1$-$C_{12}$ alkyl, optionally substituted by one or more of groups chosen from $C_1$-$C_6$ alkoxy, halo, nitro, and cyano; and an alkali metal cation; or (II) a compound having at least one $C_1$-$C_{12}$ alkanoyloxy moiety of the formula

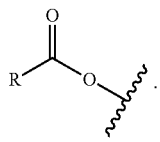

to afford a compound of the formula (I)

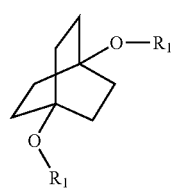

wherein each $R_1$ is independently hydrogen or a group of the formula

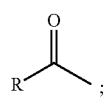

(B) contacting the compound of the formula (I)

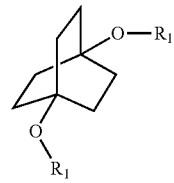

wherein each $R_1$ is independently hydrogen or a group of the formula

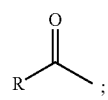

with carbon monoxide in the presence of a strong acid, followed by quenching with at least one of (i) water or (ii) an alcohol of the formula R—OH, to afford compound of the formula

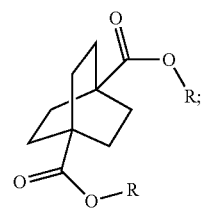

(C) optionally treating the compound of the formula

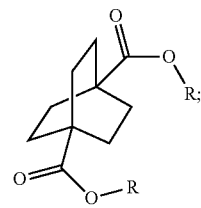

with an oxidizing agent to afford a compound of the formula:

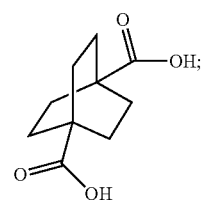 [SMILES: O=C(O)C12CCC(C(=O)O)(CC1)CC2]

(D) reacting at least one of the compounds

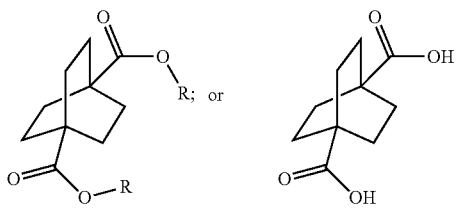

with a difunctional hydroxyl compound selected from the group consisting of 1,4-butanediol, neopentyl glycol, and 1,4-cyclohenxanedimethanol; and (E) subjecting the resulting product to one or more polycondensation reaction steps to form a polyester.

Further aspects of the invention are as disclosed and claimed herein.

DETAILED DESCRIPTION

The term "residue", as used herein, means any organic structure incorporated into a polymer through a polycondensation and/or an esterification reaction from the corresponding monomer. The term "repeating unit", as used herein, means an organic structure having a dicarboxylic acid residue and a diol residue bonded through a carbonyloxy group. The term "semi-crystalline", as used herein, indicates that the polyesters have a substantially amorphous yet partially crystalline morphology, meaning that the polyesters comprise substantially unordered regions of polymer along with some ordered regions. The crystallization half-times of the polyesters of the present invention are in part indicative of their characterization as semi-crystalline.

The present invention, in a first aspect, is directed to a semi-crystalline polyester that includes a repeat unit of the formula (II)

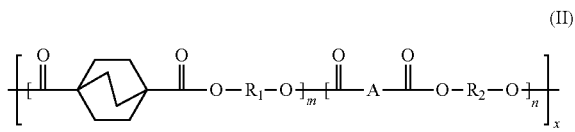

wherein A is an aliphatic, aromatic, or heterocyclic group; $R_1$ is selected from the group consisting of 1,4-butanediol and 1,4-cyclohexanedimethanol residues; $R_2$ is neopentanediol residue; m is between 50 and 99 inclusive; n is between 1 and 50 inclusive; x is between 1 and 200 inclusive, or between 80 and 160 inclusive; and wherein said semi-crystalline polyester exhibits a minimum crystallization half-time of about 0.3 minutes or greater, or about 0.5 minutes or greater or about 0.6 minutes or greater or about 0.7 minutes or greater. The polyesters of this aspect of the present invention, in various embodiments, demonstrate one or more desirable performance characteristics and accordingly are particularly useful in applications and utilities wherein those high levels of performance in such characteristics are required.

"Polyester" as used herein is meant to generally include without limitation homopolyesters as well as copolyesters, terpolyesters and the like and are typically prepared by reacting a difunctional carboxylic acid or its ester, often a dicarboxylic acid, or mixtures of such acids or esters, with a difunctional hydroxyl compound, often a diol or glycol, or mixtures of such diols or glycols. Alternatively, the difunctional carboxylic acid may be a hydroxy carboxylic acid and the difunctional hydroxyl compound may be an aromatic nucleus bearing 2 hydroxyl substituents such as, for example, hydroquinone. Polyesters and polyester manufacture are generally well known and are exemplified in for example U.S. Pat. No 7,781,562, assigned to the assignee of the present invention, the contents and disclosure of which are hereby incorporated herein by reference.

The substituent or group "A" in the above formula is selected from the group consisting of an aliphatic group, an aromatic group and a heterocyclic group. Suitable examples for group A include residues of, without limitation, succinic acid, sebacic acid, azelaic acid, adipic acid, dimer acid such as that commercially available under the trade name Empol® 1010, glutaric acid, 1,4-cyclohexanedicarboxylic acid, isophthalic acid, carbonic acid, pimelic acid, dimethylmalonic acid, 2,6-naphthalenedicarboxylic acid, phthalic acid, suberic acid, 1,12-dodecanedicarboxylic acid, 4,4'-sulfonyldibenzoic acid, diglycolic acid, 1,3-phenylenedioxydiacetic acid, 5-(sodiosulfo)isophthalic acid and 4,4'-stilbenedicarboxylic acid.

In one or more embodiments, $R_1$ and $R_2$ are each independently selected from the group consisting of 1,2-ethylene glycol, 1,3-propanediol, 1,4-butanediol, 1,5-pentanediol, 1,6-hexanediol, 1,8-octanediol, 1,10-decanediol, neopentyl glycol, neopentanediol, 2,2,4-trimethyl-1,3-pentanediol, 1,4-cyclohexanedimethanol, 1,3-cyclohexanedimethanol, 1,2-cyclohexanedimethanol, 2,2,4,4,-tetramethyl-1,3-cyclobutanediol, diethylene glycol, triethylene glycol, isosorbide, poly(oxytetramethyleneglycol), bicyclo[2.2.2]octane-1,4-dimethanol and 1,4-benzenedimethanol residues and mixtures thereof. In one or more embodiments, $R_1$ is selected from the group consisting of 1,2-ethylene glycol, 1,3-propanediol, 1,4-butanediol, neopentyl glycol, 1,4-cyclohexanedimethanol and bicyclo[2.2.2]octane-1,4-dimethanol residues and $R_2$ is selected from the group consisting of 1,2-ethylene glycol, 1,4-butanediol, neopentanediol, neopentyl glycol and 2,2,4,4,-tetramethyl-1,3-cyclobutanediol residues. In one or more embodiments, $R_1$ is 1,4-butanediol residue. In one or more embodiments, $R_1$ is 1,4-cyclohexanedimethanol residue. In one or more embodiments, $R_2$ is neopentanediol residue.

The value for "m" may be between 50 and 99 inclusive, or between 65 and 95 inclusive, or between 80 and 90 inclusive. The value for n may be between 1 and 50 inclusive or between 5 and 35 inclusive, or between 10 and 20 inclusive. The value for x may be between 1 and 200 inclusive. Accordingly, semi-crystalline polyesters of the present invention may include other polyester repeat units. The semi-crystalline polyesters of the present invention preferably include from 1 to 100 mol % of the repeat units of the formula (II) above.

Such other polyester repeat units repeat units are well known in the art and are exemplified in above-referenced U.S. Pat. No. 7,781,562. In brief, such repeat units are prepared by the reaction of one or more difunctional carboxylic acids and/or multifunctional carboxylic acids with one or more difunctional hydroxyl compounds and/or multifunctional hydroxyl compounds. Typically, the difunctional carboxylic acid can be a dicarboxylic acid and the difunctional hydroxyl compound can be a dihydric alcohol such as, for example, glycols and diols. The term "glycol" as used in this application includes, but is not limited to, diols, glycols, and/or multifunctional hydroxyl compounds, for example, branching agents. Alternatively, the difunctional carboxylic acid may be a hydroxy carboxylic acid such as, for example, p-hydroxybenzoic acid, and the difunctional hydroxyl compound may be an aromatic nucleus bearing 2 hydroxyl substituents such as, for example, hydroquinone. Thus, for example, the dicarboxylic acid residues may be derived from a dicarboxylic acid monomer or its associated acid halides, esters, salts, anhydrides, or mixtures thereof. As used herein, therefore, the term dicarboxylic acid is intended to include dicarboxylic acids and any derivative of a dicarboxylic acid, including its associated acid halides, esters, half-esters, salts, half-salts, anhydrides, mixed anhydrides, or mixtures thereof, useful in a reaction process with a diol to make polyester. Furthermore, as used in this application, the term "diacid" includes multifunctional acids, for example, branching agents.

It should be noted that the notation used in the above formulas for the repeat unit does not alone specify or indicate any particular polymer morphology. Nonetheless, in one or more embodiment, the polyester of the present invention is a semi-crystalline polyester.

In an embodiment, the semi-crystalline polyesters of the present invention have a minimum crystallization half-time of about 0.3 minutes or greater, or about 0.5 minutes or greater or about 0.6 minutes or greater or about 0.7 minutes or greater.

In one or more embodiments, the semi-crystalline polyesters of the present invention have a melt point of from 240° C. to 275° C., or from 255° C. to 275° C. when measured using DSC techniques known in the art with standard commercially available equipment. Particularly suitable semi-crystalline copolymers of the present invention have a melt point of from 240° C. to 275° C. and include 1,4-cyclohexanedimethanol residue as $R_1$.

The semi-crystalline polyesters of the present invention, in one or more embodiments, exhibit improved weatherability. Weatherability and analytical methods for its measurement are well known in the art and are exemplified by ASTM methods D1435-12 and D4364-13 (accelerated).

In other aspect, the present invention is directed to a method for forming a polyester that includes repeat units of the formula (I) above. The method of the present invention includes the steps of (A) contacting a compound of the formula

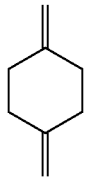

with (i) a transition metal catalyst comprising a palladium compound and (ii) an oxidizing agent, optionally in the presence of at least one of (I) a compound of the formula

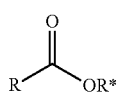

wherein R is chosen from hydrogen; and $C_1$-$C_{12}$ alkyl, optionally substituted by one or more of groups chosen from $C_1$-$C_6$ alkoxy, halo, nitro, and cyano; R* is chosen from hydrogen; $C_1$-$C_{12}$ alkyl, optionally substituted by one or more of groups chosen from $C_1$-$C_6$ alkoxy, halo, nitro, and cyano; and an alkali metal cation; or (II) a compound having at least one $C_1$-$C_{12}$ alkanoyloxy moiety of the formula

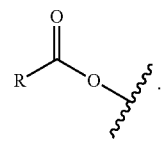

to afford a compound of the formula

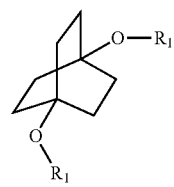

(I)

wherein each $R_1$ is independently hydrogen or a group of the formula

(B) contacting the compound of the formula

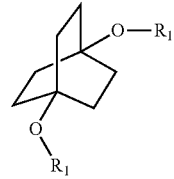

(I)

wherein each $R_1$ is independently hydrogen or a group of the formula

with carbon monoxide in the presence of a strong acid, followed by quenching with at least one of (i) water or (ii) an alcohol of the formula R—OH, to afford compound of the formula

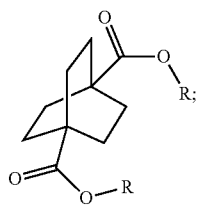

(C) optionally treating the compound of the formula

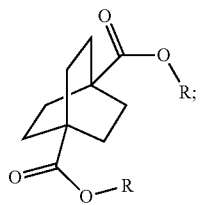

with an oxidizing agent to afford a compound of the formula:

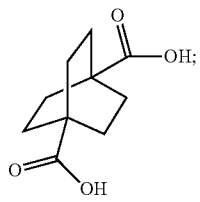 [SMILES: O=C(O)C12CCC(C(=O)O)(CC1)CC2]

(D) reacting at least one of the compounds

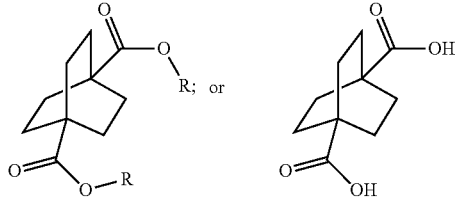

with a difunctional hydroxyl compound selected from the group consisting of 1,4-butanediol, neopentyl glycol, and 1,4-cyclohenxanedimethanol; and (E) subjecting the resulting product to one or more polycondensation reaction steps to form a polyester.

Suitable compounds and methods for their manufacture are known in the art and described for example in WO2018/075301 A1 assigned to the assignee of the present invention, the contents and disclosure of which are each hereby incorporated herein by reference. Particularly suitable compounds are bicyclo [2.2.2] octane compounds selected from the group consisting of 4-(methoxycarbonyl)bicyclo[2.2.2] octane-1-carboxylic acid and dimethyl bicyclo[2.2.2]octane-1,4-dicarboxylate.

The present invention, in another aspect, is directed to composition that includes a semi-crystalline polyester including a repeat unit of the formula (II):

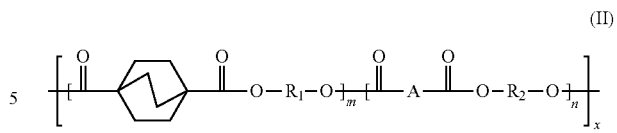

(II)

wherein A is an aliphatic, aromatic, or heterocyclic group; $R_1$ is selected from the group consisting of 1,4-butanediol residue and 1,4-cyclohexanedimethanol residue; $R_2$ is neopentanediol residue; m is between 50 and 99 inclusive; n is between 1 and 50 inclusive; x is between 1 and 200 inclusive, or between 80 and 160 inclusive; and wherein said semi-crystalline polyester exhibits a minimum crystallization half-time of about 0.3 minutes or greater, or about 0.5 minutes or greater or about 0.6 minutes or greater or about 0.7 minutes or greater.

The compositions of the present invention preferably may include at least 5 weight percent or at least 10 weight percent or least 20 weight percent or at least 30 weight percent or at least 40 weight percent or least 50 weight percent of the semi-crystalline polyester of the present invention.

The compositions of the present invention may further include at least one other polymer. Suitable polymers for the composition of the present invention include by way of non-limiting example polycarbonates, acrylics, polystyrenes, cellulose esters, polydimethylsiloxanes and the like.

The compositions of the present invention also may contain one or more other conventional additives and ingredients. For example, additives such as reinforcements, mold release additives, fillers, surface friction modifiers, light and heat stabilizers, extrusion aids, antistatic agents, colorants, dyes, pigments, fluorescent brighteners, antimicrobials, anti-counterfeiting markers, hydrophobic and hydrophilic enhancers, viscosity modifiers, slip agents, tougheners, adhesion promoters, and the like may be used. Colorants, sometimes referred to as toners, may be added to impart a desired neutral hue and/or brightness to the composition in end-use applications that specify such a feature. Optional ingredients such as these, as well as their chosen concentrations, are typically selected based on an individual composition's specific end-use specifications and application.

In another aspect, the present invention is directed to a film including the semi-crystalline polyester of the present invention. In an embodiment, the film is a monolayer film. Films of the present invention are, in an embodiment, from 1 mil to about 14 mils in thickness. The film of the present invention may be manufactured by methods well known the art as exemplified by U.S. Pat. No. 5,958,581, the contents and disclosure of which are incorporated herein by reference. An important feature of the film of the present invention is that it is capable of being oriented uniaxially or biaxially. Methods and equipment for manufacturing oriented polyester films, as well as oriented polyester films per se, are well known in the art and for example are described in U.S. Pat. Nos. 4,020,141 and 6,368,532, the contents and disclosure of which are hereby incorporated herein by reference. Accordingly, in one or more embodiments, the film of the present invention is a biaxially oriented film or a biaxially oriented monolayer film.

The film of the present invention may be generally useful in end-use applications wherein the film is exposed for an extended period to weathering, sunlight and/or ultraviolet radiation. Accordingly, in one illustrative non-limiting example, the film of the present invention is useful as the backsheet of photovoltaic module. Photovoltaic modules and their manufacture as well as module backsheets are generally known in the art as exemplified by U.S. Pat. No. 9,082,912B2 and U.S. Published Patent Application No. US2008/0053512A1, the contents and disclosure of which are each hereby incorporated herein by reference.

In another aspect, the present invention is directed to an injection molded article that includes the semi-crystalline polyester of the present invention. Injection molded articles are any articles formed using known and conventional injection molding methods and equipment such as that described for example in U.S. Pat. Nos. 5,707,667 and 3,533,594, the contents and disclosure of which are hereby incorporated herein by reference.

The following examples, while provided to illustrate with specificity and detail the many aspects and advantages of the present invention, are not be interpreted as in any way limiting its scope. Variations, modifications and adaptations which do depart of the spirit of the present invention will be readily appreciated by one of ordinary skill in the art. Throughout these examples, the following experimental and analytical techniques were employed in measuring the parameters indicated when these parameters were in fact measured:

The inherent viscosity of the polyesters was determined in 60/40 (wt/wt) phenol/tetrachloroethane at a concentration of 0.5 g/100 ml at 25° C.

The melting temperature ($T_m$) and glass transition temperature ($T_g$) were determined by using a TA Instruments Q2000 model differential scanning calorimeter (DSC). The sample was weighed to approximately 3 mgs and placed into an aluminum pan. An appropriate lid was placed on top and crimped into place. Then the sample was placed into the DSC cell accompanied by an empty aluminum pan to serve as a reference. The furnace lid was placed over the cell, and the temperature scan began. The instrument cooled the sample to 0° C. to initiate the 1st heating scan. During this heating scan, the sample was heated at a rate of 20° C./min to the maximum temperature then held isothermally for 1 minute to ensure the sample had fully melted. Next, the instrument cooled the sample at a rate of 20° C./min to 0° C. and held isothermally for 30 seconds to allow for instrument equilibration. Then, the sample was heated a 2nd time to the maximum temperature at a rate of 20° C./min. The data was transferred to Universal Analysis software and any transitions such as glass transition temperature ($T_g$), crystallization on heating ($T_{ch}$), $T_m$, or crystallization on cooling ($T_{cc}$) were integrated.

The crystallization halftime was measured on a Perkin Elmer 8500 DSC instrument. The measurement was made by measuring the heat flow of the sample versus temperature. Once a sample was prepared, the Pyrus operating software was opened, and the appropriate identifying information was inputted. The sample was loaded into the DSC cell along with an empty pan to serve as a reference. The furnace lid was put into place and the test began. The instrument heated the sample from 0° C. to $T_{max}$ and was held isothermally at $T_{max}$ for 2 minutes to ensure full melting of the sample. Then, the sample was cooled at the fastest rate the instrument was designed to reach, up to 600° C./min, to the first designated crystallization temperature and held isothermally for a prescribed amount of time, typically 30 minutes. If there were additional crystallization temperatures, the sample would then be reheated to $T_{max}$ at the 600° C./min rate and held isothermally for 2 minutes. Then it would be cooled to the next crystallization temperature as described previously. This pattern of heating, cooling, and isothermal holds would continue until all the crystallization temperatures had been tested. Once the testing was complete, the data was analyzed on a heat flow versus time graph and by integrating the onset of the isothermal hold and the maximum of the crystallization peak. The time at the onset of the isothermal hold was subtracted from the time at the peak of the maximum, and the result was the crystallization halftime at that crystallization temperature. The "minimum crystallization half-time" (sometimes referred to herein $t_{1/2}$) is the minimum length of time required to achieve approximately half of the maximum crystallinity achievable at a given crystallization temperature. $t_{1/2}$ depends in part on the crystallization temperature $T_c$, and $t_{1/2}$ is typically at its minimum, i.e., maximum crystallization rate, at a temperature approximately half way between the glass transition temperature ($T_g$) and the melt temperature ($T_m$).

EXAMPLE 1 (Control)

A monomer composition of a mixture of 0.10 mol of 4-(methoxycarbonyl)bicyclo[2.2.2]octane-1-carboxylic acid, 0.15 mol of 1,4-butanediol, 0.0029 g of titanium oxide was placed in a 250-mL flask equipped with an inlet for nitrogen, a metal stirrer, and a short distillation column. The flask was placed in a metal bath at 200° C. The stirring speed was set to 200 RPM. The contents of the flask were heated at 200° C. for 5 minutes and then the temperature was gradually increased to 255° C. over 3 hours. The reaction mixture was held at 255° C. for 10 minutes and then vacuum was gradually applied over the next 10 minutes until the pressure inside the flask reached 100 mmHg. The pressure inside the flask was further reduced to 0.5 mmHg over the next 5 minutes. The stirring speed was set to 100 RPM. A pressure of 0.5 mmHg was maintained for a total time of 3 hours to remove excess unreacted diols. A polyester (Poly (1,4-butylene 1,4-bicyclo[2.2.2]octanedicarboxylate) with an IV of 0.872, a $T_g$ of 53.6° C., and a $T_m$ of 193.6° C. was obtained. Rapid crystallization was observed and therefore crystallization half-time was not measured.

EXAMPLE 2

The procedure used to form a polyester as set forth in Example 1 was employed in Example 2 using the following monomer composition: 0.10 mol of dimethyl bicyclo[2.2.2] octane-1,4-dicarboxylate, 0.135 mol of 1,4-butanediol, and 0.015 mol of neopentyl glycol. A polyester (Poly[(1,4-butylene 1,4-bicyclo[2.2.2]octanedicarboxylate)-co-(neopentylene 1,4-bicyclo[2.2.2]octanedicarboxylate)], 1,4-butylene:neopetylene=90:10) with an IV of 0.905, a $T_g$ of 47.0° C., and a $T_m$ of 182.0° C. was obtained. The crystallization half-time for this material was then measured at multiple temperatures with measured crystallization half-times as follows: 2.1 min at 80° C., 1.0 min at 90° C., 0.7 min at 100° C., 0.6 min at 105° C., 0.6 min at 110° C., 0.7 min at 115° C., 0.8 min at 120° C., 1.3 min at 130° C., and 2.1 min at 140° C. The sample therefore is characterized by a minimum crystallization half-time of 0.6 minutes.

EXAMPLE 3

The procedure used to form a polyester as set forth in Example 1 was employed in Example 3 using the following monomer composition: 0.10 mol of dimethyl bicyclo[2.2.2] octane-1,4-dicarboxylate, 0.132 mol of 1,4-butanediol, and 0.018 mol of neopentyl glycol. A polyester (Poly[(1,4-butylene 1,4-bicyclo[2.2.2]octanedicarboxylate)-co-(neopentylene 1,4-bicyclo[2.2.2]octanedicarboxylate)], 1,4-butylene:neopetylene=88:12) with an IV of 0.998, a $T_g$ of 48.0° C., and a $T_m$ of 165.0° C. was obtained. The crystallization half-time for this material was then measured at multiple temperatures with measured crystallization half-times as follows: 0.9 min at 80° C., 0.4 min at 90° C., 0.3 min at 100° C., 105° C., 110° C., and 115° C., 0.4 min at 120° C., 0.9 min at 130° C., and 1.7 min at 140° C. The sample therefore is characterized by a minimum crystallization half-time of 0.3 minutes.

EXAMPLE 4

The procedure used to form a polyester as set forth in Example 1 was employed in Example 4 using the following monomer composition: 0.10 mol of dimethyl bicyclo[2.2.2]octane-1,4-dicarboxylate, 0.128 mol of 1,4-butanediol, and 0.023 mol of neopentyl glycol. A polyester (Poly[(1,4-butylene 1,4-bicyclo[2.2.2]octanedicarboxylate)-co-(neopentylene 1,4-bicyclo[2.2.2]octanedicarboxylate)], 1,4-butylene:neopetylene=85:15) with an IV of 0.904, a $T_g$ of 42.0° C., and a $T_m$ of 151.0° C. was obtained. The crystallization half-time for this material was then measured at multiple temperatures with measured crystallization half-times as follows: 10.8 min at 80° C., 5.8 min at 90° C., 4.6 min at 100° C., 4.5 min at 105° C., 4.9 min at 110° C., 5.6 min at 115° C., 7.2 min at 120° C., 14.2 min at 130° C., and 20.0 min at 140° C. The sample therefore is characterized by a minimum crystallization half-time of 4.5 minutes.

EXAMPLE 5 (Control)

A mixture of 0.10 mol of 4-(methoxycarbonyl)bicyclo[2.2.2]octane-1-carboxylic acid, 0.11 mol of 1,4-cyclohexanedimethanol (cis/trans=31/69), 0.0029 g of titanium oxide was placed in a 250-mL flask equipped with an inlet for nitrogen, a metal stirrer, and a short distillation column. The flask was placed in a metal bath at 200° C. The stirring speed was set to 200 RPM. The contents of the flask were heated at 200° C. for 5 minutes and then the temperature was gradually increased to 255° C. over 3 hours. The temperature was further gradually increased to 280° C. over 10 minutes. The reaction mixture was held at 280° C. The pressure inside the flask was reduced to 400 mmHg over 5 minutes. The pressure was further reduced to 100 mmHg and the stirring speed was reduced to 100 RPM over 5 minutes. The pressure was further reduced to 0.5 mmHg and the stirring speed was reduced to 50 RPM over 5 minutes. A pressure of 0.5 mmHg was maintained for a total time of 3 hours to remove excess unreacted diols. A polyester (Poly(1,4-cyclohexanedimethylene 1,4-bicyclo[2.2.2]octanedicarboxylate) with an IV of 0.629, a $T_g$ of 131° C., and a $T_m$ of 299.0° C. was obtained. The crystallization half-time for this material was then measured at multiple temperatures with measured crystallization half-times as follows: 0.1 min at 210° C., 0.2 min at 220° C., and 0.3 min at 230° C. The crystallization half-time for this material at 170° C., 180° C., 190° C., and 200° C. were too short (less than 0.1 min) to be accurately determined.

EXAMPLE 6

The procedure used to form a polyester as set forth in Example 5 was employed in Example 7 using the following monomer composition: 0.10 mol of 4-(methoxycarbonyl)bicyclo[2.2.2]octane-1-carboxylic acid, 0.097 mol of 1,4-cyclohexanedimethanol (cis/trans=31/69), and 0.018 mol of neopentyl glycol. A polyester (Poly[(1,4-cyclohexanedimethylene 1,4-bicyclo[2.2.2]octanedicarboxylate)-co-(neopentylene 1,4-bicyclo[2.2.2]octanedicarboxylate)], 1,4-cyclohexanedimethylene:neopetylene=88:12) with an IV of 0.689, a $T_g$ of 123° C., and a $T_m$ of 274° C. was obtained. The crystallization half-time for this material was then measured at multiple temperatures with measured crystallization half-times as follows: 2.4 min at 160° C., 1.4 min at 170° C., 0.5 min at 175° C., 0.4 min at 185° C., 0.4 min at 195° C., 0.5 min at 205° C., and 0.8 min at 215° C. The sample therefore was characterized by a minimum crystallization half-time of 0.4 minutes.

EXAMPLE 7

The procedure used to form a polyester as set forth in Example 5 was employed in Example 8 using the following monomer composition: 0.10 mol of 4-(methoxycarbonyl)bicyclo[2.2.2]octane-1-carboxylic acid, 0.096 mol of 1,4-cyclohexanedimethanol (cis/trans=31/69), and 0.023 mol of neopentyl glycol. A polyester (Poly[(1,4-cyclohexanedimethylene 1,4-bicyclo[2.2.2]octanedicarboxylate)-co-(neopentylene 1,4-bicyclo[2.2.2]octanedicarboxylate)], 1,4-cyclohexanedimethylene:neopetylene=85:15) with an IV of 0.610, a $T_g$ of 110° C., and a $T_m$ of 255° C. was obtained. The crystallization half-time for this material was then measured at multiple temperatures with measured crystallization half-times as follows: 13.4 min at 160° C., 7.1 min at 170° C., 6.1 min at 180° C., 6.0 min at 190° C., and 7.8 min at 200° C. The sample therefore was characterized by a minimum crystallization half-time of 6.0 minutes.

EXAMPLE 8 (Control)

The procedure used to form a polyester as set forth in Example 5 was employed in Example 9 using the following monomer composition: 0.10 mol of 4-(methoxycarbonyl)bicyclo[2.2.2]octane-1-carboxylic acid, 0.088 mol of 1,4-cyclohexanedimethanol (cis/trans=31/69), and 0.030 mol of neopentyl glycol. A polyester (Poly[(1,4-cyclohexanedimethylene 1,4-bicyclo[2.2.2]octanedicarboxylate)-co-(neopentylene 1,4-bicyclo[2.2.2]octanedicarboxylate)], 1,4-cyclohexanedimethylene:neopetylene=80:20) with an IV of 0.765, a $T_g$ of 116° C., and a $T_m$ of 244° C. was obtained. The crystallization half time of this material between 110° C. to 200° C. was considerably slow (longer than 30 minutes) and was therefore not determined.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

That which is claimed is:

1. A semi-crystalline polyester comprising a repeat unit of the formula:

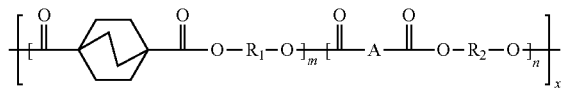

wherein A is an aliphatic, aromatic, or heterocyclic group; $R_1$ is selected from the group consisting of 1,4-butanediol residue and 1,4-cyclohexanedimethanol residue; $R_2$ is neopentanediol residue; m is between 50 and 99 inclusive; n is between 1 and 50 inclusive; x is between 1 and 200 inclusive; and wherein said semi-crystalline polyester exhibits a minimum crystallization half-time of about 0.3 minutes or greater.

2. The semi-crystalline polyester of claim 1 wherein said minimum crystallization half-time is 0.5 minutes or greater.

3. The semi-crystalline polyester of claim 2 wherein said minimum crystallization half-time is 0.6 minutes or greater.

4. The semi-crystalline polyester of claim 1 wherein said semi-crystalline polyester has a melt point of between 240° C. and 275° C.

5. The semi-crystalline polyester of claim 1 wherein $R_1$ is 1,4-butanediol residue.

6. The semi-crystalline polyester of claim 1 wherein $R_1$ is 1,4-cyclohexanedimethyl residue.

7. The semi-crystalline polyester of claim 1 wherein m is between 65 and 95 inclusive.

8. The semi-crystalline polyester of claim 1 wherein n is between 5 and 35 inclusive.

9. The semi-crystalline polyester of claim 1 wherein n is between 10 and 20 inclusive.

10. A composition comprising the semi-crystalline polyester of claim 1.

11. The composition of claim 10 further comprising at least one ingredient selected from the group consisting of reinforcements, mold release additives, fillers, surface friction modifiers, light and heat stabilizers, extrusion aids, antistatic agents, colorants, dyes, pigments, fluorescent brighteners, antimicrobials, anticounterfeiting markers, hydrophobic and hydrophilic enhancers, viscosity modifiers, slip agents, tougheners, adhesion promoters toners and colorants.

12. A film comprising the semi-crystalline polyester of claim 1.

13. The film of claim 12 wherein said film is a monolayer film.

14. The film of claim 13 wherein said monolayer film is biaxially oriented.

15. The film of claim 12 wherein said film is the backsheet of a photovoltaic module.

16. The film of claim 12 wherein said monolayer film is the backsheet of a photovoltaic module.

17. A photovoltaic module comprising the film of claim 12.

18. An injection molded article comprising the semi-crystalline polyester of claim 1.

* * * * *